US012684859B2

(12) United States Patent
Jeon et al.

(10) Patent No.: US 12,684,859 B2
(45) Date of Patent: Jul. 14, 2026

(54) METHOD OF FORMING SEMICONDUCTOR DEVICE INCLUDING SEMICONDUCTOR LINER

(71) Applicant: SK hynix Inc., Gyeonggi-do (KR)

(72) Inventors: Bong Seok Jeon, Gyeonggi-do (KR); Ji Yong Kim, Gyeonggi-do (KR); Hai Won Kim, Gyeonggi-do (KR); Jeong Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 512 days.

(21) Appl. No.: 18/465,996

(22) Filed: Sep. 13, 2023

(65) Prior Publication Data

US 2024/0371701 A1 Nov. 7, 2024

(30) Foreign Application Priority Data

May 4, 2023 (KR) ......................... 10-2023-0058054

(51) Int. Cl.
| | |
|---|---|
| *H10D 84/03* | (2025.01) |
| *H10B 12/00* | (2023.01) |
| *H10D 84/01* | (2026.01) |
| *H10D 84/83* | (2025.01) |
| *H10W 10/00* | (2026.01) |
| *H10W 10/17* | (2026.01) |

(52) U.S. Cl.
CPC ......... *H10D 84/038* (2025.01); *H10B 12/033* (2023.02); *H10B 12/0335* (2023.02); *H10B 12/05* (2023.02); *H10B 12/053* (2023.02); *H10B 12/482* (2023.02); *H10D 84/0149* (2025.01); *H10D 84/0151* (2025.01); *H10D 84/83* (2025.01); *H10W 10/014* (2026.01); *H10W 10/17* (2026.01)

(58) Field of Classification Search
CPC ...... H10B 12/02–09; H10B 12/30–488; H10B 12/033–0335; H10B 12/05–056; H10B 12/31–318; H10B 12/34; H10D 62/115; H10D 62/116; H10D 84/0151; H10D 84/0153; H10D 84/0188; H10D 30/0243; H10W 10/014–0148; H10W 10/17; H01L 21/76224; H01L 21/76229; H01L 21/76232; H10P 14/6304–6312; H10P 14/6316; H10P 14/6318
See application file for complete search history.

(56) References Cited

U.S. PATENT DOCUMENTS

| | | | |
|---|---|---|---|
| 6,350,662 B1 | 2/2002 | Thei et al. | |
| 2021/0057266 A1* | 2/2021 | Yadav ................... | H10P 50/283 |
| 2022/0102193 A1* | 3/2022 | Kim ................... | H10W 10/014 |

FOREIGN PATENT DOCUMENTS

| | | |
|---|---|---|
| KR | 10-2005-0025820 A | 3/2005 |
| KR | 10-2022-0041358 A | 4/2022 |

* cited by examiner

*Primary Examiner* — Younes Boulghassoul
(74) *Attorney, Agent, or Firm* — IP & T GROUP LLP

(57) ABSTRACT

A method for forming a semiconductor device may include forming, on a substrate, a trench which delimits a preliminary active region. A buffer layer may be formed on the preliminary active region using a first heat treatment process that is performed at 520° C. to 580° C. A sacrificial layer may be formed by replacing the buffer layer. An active region may be exposed by removing the sacrificial layer. A semiconductor liner may be formed on the active region.

19 Claims, 12 Drawing Sheets

| | |
|---|---|
| Form trench delimiting preliminary active region | B10 |
| Form buffer layer | B20 |
| Form sacrificial layer | B30 |
| Expose active region by removing sacrificial layer | B40 |
| Form semiconductor liner | B50 |
| Form isolation layer | B60 |

| | |
|---|---|
| Form trench delimiting preliminary active region | ~B10 |
| Form buffer layer | ~B20 |
| Form sacrificial layer | ~B30 |
| Expose active region by removing sacrificial layer | ~B40 |
| Form semiconductor liner | ~B50 |
| Form isolation layer | ~B60 |
| Form word line | ~B170 |
| Form bit line | ~B180 |
| Form bottom electrode | ~B190 |
| Form top electrode | ~B195 |

METHOD OF FORMING SEMICONDUCTOR DEVICE INCLUDING SEMICONDUCTOR LINER

CROSS-REFERENCE TO RELATED APPLICATION

The present application claims priority under 35 U.S.C. § 119 (a) to Korean Patent Application No. 10-2023-0058054 filed in the Korean Intellectual Property Office on May 4, 2023, which is incorporated herein by reference in its entirety.

BACKGROUND

1. Technical Field

Various embodiments generally relate to a method of forming a semiconductor device including a semiconductor liner, and a related device.

2. Related Art

As semiconductor devices have become highly integrated, the pitch of a plurality of active regions is decreasing. The aspect ratio of each of the plurality of active regions is gradually increasing. The manufacturing process of a semiconductor device may include a plurality of heat treatment processes and a plurality of patterning processes.

An active region with a high aspect ratio may be vulnerable to a defect such as leaning. The defect such as the leaning of an active region makes subsequent processing difficult, may decrease productivity, and may cause poor electrical characteristics.

SUMMARY

Various embodiments are directed to providing a method of forming a semiconductor device capable of preventing leaning of an active region, and a related semiconductor device.

In one embodiment of the disclosed technology, a method for forming a semiconductor device may include forming, on a substrate, a trench which delimits a preliminary active region. A buffer layer may be formed on the preliminary active region using a first heat treatment process that is performed at 520° C. to 580° C. A sacrificial layer may be formed by replacing the buffer layer. An active region may be exposed by removing the sacrificial layer. A semiconductor liner may be formed on the active region.

In another embodiment of the disclosed technology, a method for forming a semiconductor device may include forming, on a substrate, an isolation layer which delimits an active pattern. A word line which traverses the active pattern may be formed. A plurality of source/drain regions may be formed in the active pattern adjacent to the word line. A bit line which is connected to one selected among the plurality of source/drain regions may be formed. A bottom electrode which is connected to another one selected among the plurality of source/drain regions may be formed. A capacitor dielectric layer may be formed on the bottom electrode. A top electrode may be formed on the capacitor dielectric layer. The forming of the isolation layer may include: forming, on the substrate, a trench which delimits a preliminary active region; forming a buffer layer on the preliminary active region using a first heat treatment process that is performed at 520° C. to 580° C.; forming a sacrificial layer by replacing the buffer layer; exposing an active region by removing the sacrificial layer; forming a semiconductor liner on the active region; and forming the isolation layer in the trench. The active region and the semiconductor liner may configure the active pattern.

In another embodiment of the disclosed technology, a method for forming a semiconductor device may include forming, on a substrate, a trench which delimits a preliminary active region. A buffer layer which has a thickness of 0.1 nm to 1 nm may be formed on the preliminary active region using a first heat treatment process. A sacrificial layer may be formed by replacing the buffer layer. An active region may be exposed by removing the sacrificial layer. A semiconductor liner may be formed on the active region.

According to various embodiments of the disclosed technology, a buffer layer may be formed using a first heat treatment process. A sacrificial layer may be formed by replacing the buffer layer, and an active region may be exposed by removing the sacrificial layer. A semiconductor liner may be formed on the active region. The buffer layer may serve to prevent the occurrence of a defect such as leaning of the active region. It is possible to implement a semiconductor device which is advantageous for high integration and which has excellent electrical characteristics.

DETAILED DESCRIPTION

Figure 1:
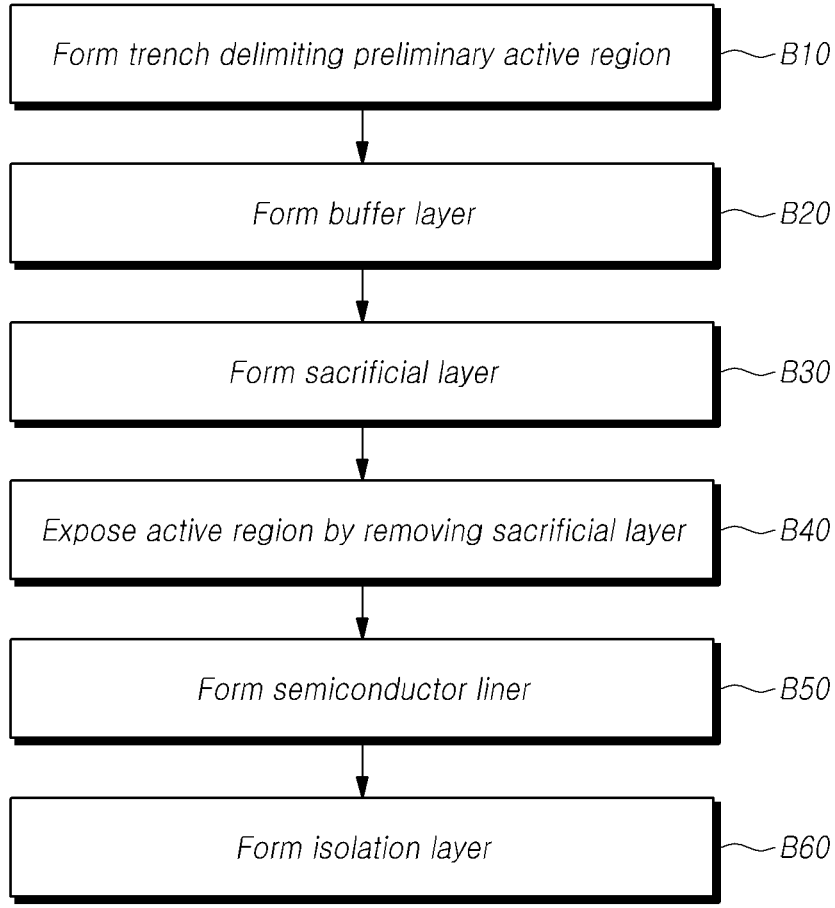
FIG. 1 is a flowchart for explaining a method for forming a semiconductor device based on one embodiment of the disclosed technology.
Figure 2:
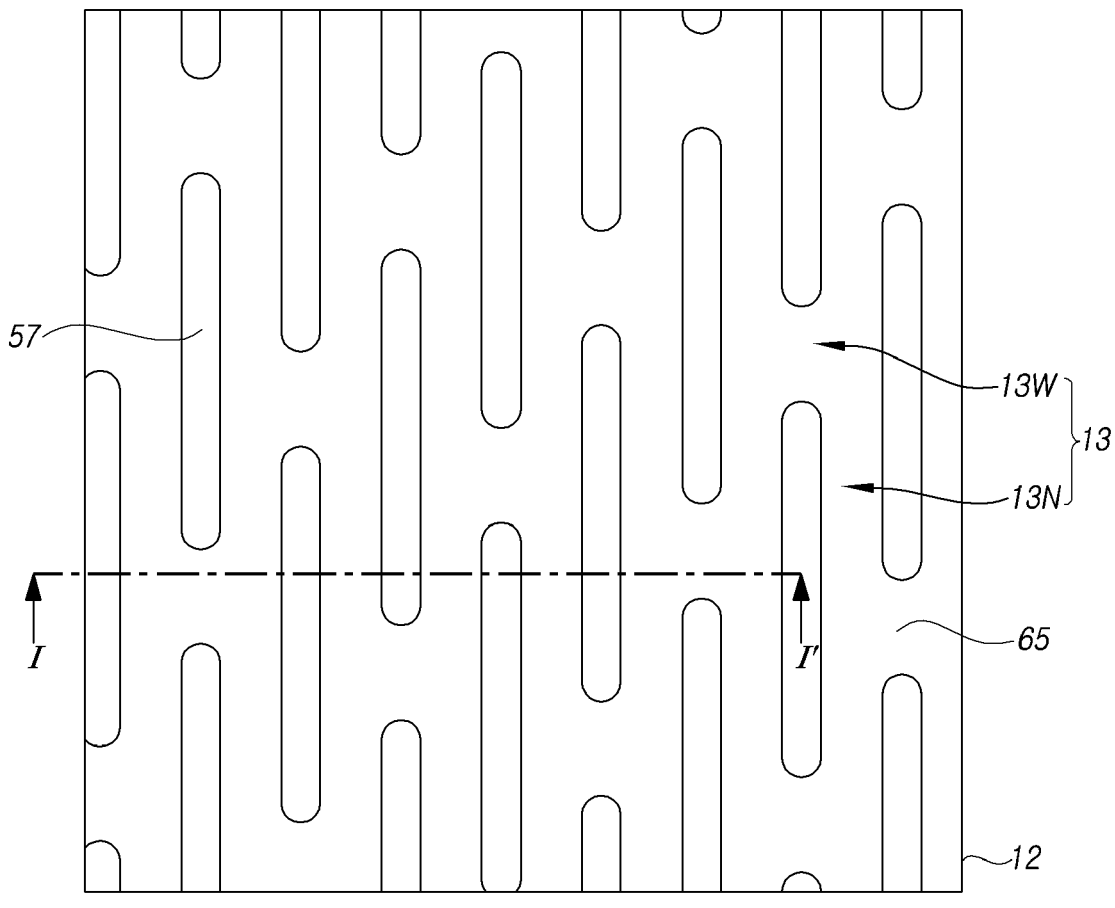
FIG. 2 is a layout diagram for explaining the method for forming a semiconductor device based on various embodiments of the disclosed technology.
Figure 4:
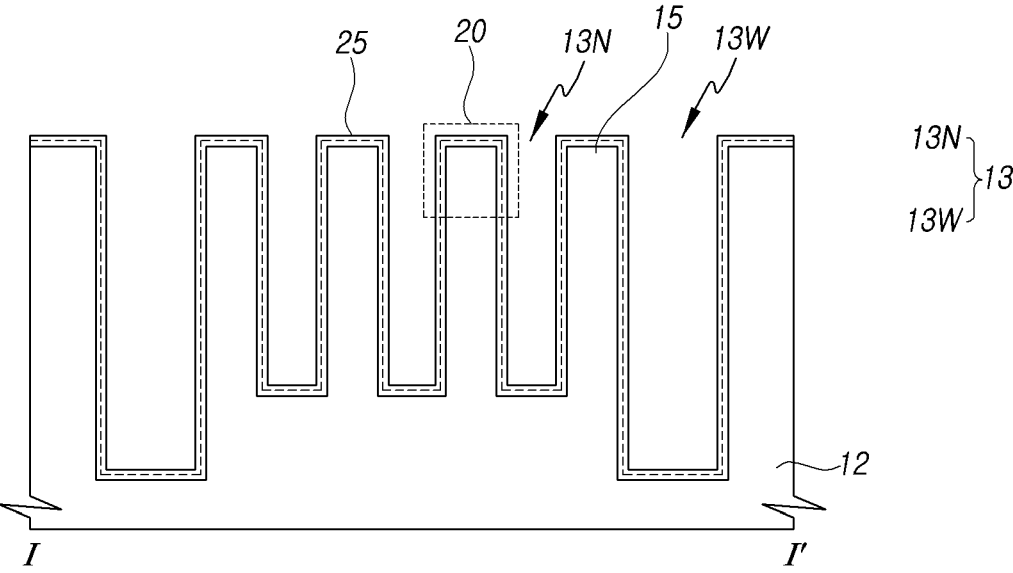
Figure 5:
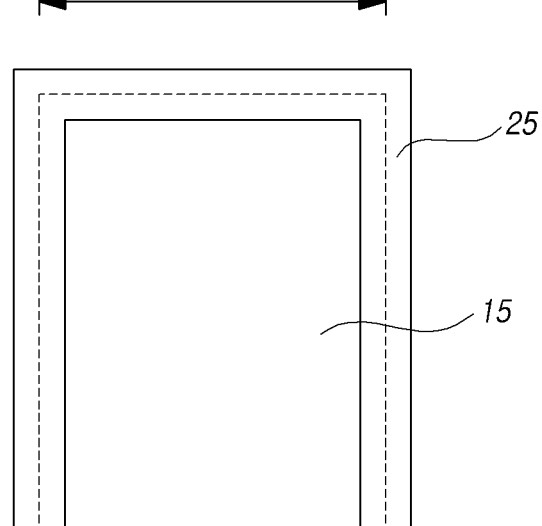
FIG. 5 is a partial view for explaining a portion of FIG. 4.

FIG. 1 is a flowchart for explaining a method for forming a semiconductor device based on one embodiment of the disclosed technology. FIG. 2 is a layout diagram for explaining the method for forming a semiconductor device based on various embodiments of the disclosed technology, FIGS. 3, 4, 6, 7, 8 and 10 are cross-sectional views taken along the line I-I' of FIG. 2, FIG. 5 is a partial view for explaining a portion 20 of FIG. 4, and FIG. 9 is a partial view for explaining a portion 50 of FIG. 8.

Referring to FIG. 1, the method for forming a semiconductor device based on this embodiment of the disclosed technology may include forming a trench delimiting a preliminary active region (B10), forming a buffer layer (B20), forming a sacrificial layer (B30), exposing an active region by removing the sacrificial layer (B40), forming a semiconductor liner (B50), and forming an isolation layer (B60).

Referring to FIG. 2, a plurality of active patterns 57 may be regularly disposed on a substrate 12. The plurality of active patterns 57 may be delimited by a trench 13 which is formed in the substrate 12. The trench 13 may include a first trench 13N and a second trench 13W which communicates with the first trench 13N. The second trench 13W may have a larger width than the first trench 13N. An isolation layer 65 may be formed in the trench 13. Each of the plurality of active patterns 57 may be delimited by the trench 13 and/or an isolation layer 65.

Figure 3:
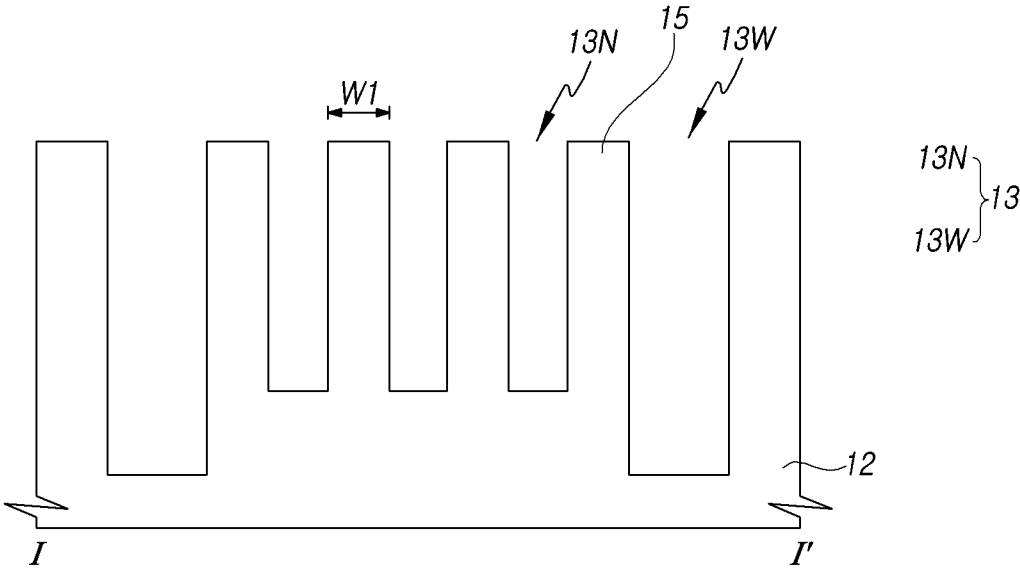
FIGS. 3, 4, 6, 7, 8 and 10 are cross-sectional views for explaining the inventive method for forming a semiconductor device based on the various embodiments of the disclosed technology.

Referring to FIGS. 1, 2 and 3, the method for forming a semiconductor device based on various embodiments of the disclosed technology may include forming the trench 13 which delimits a preliminary active region 15, in the substrate 12 (B10). A plurality of preliminary active regions 15 may be regularly disposed. The preliminary active region 15 may have a first width W1.

The substrate 12 may include a semiconductor substrate such as for example a silicon wafer or a silicon on insulator (SOI) wafer. The substrate 12 may include a III-V group semiconductor substrate, such as for example, a compound semiconductor substrate such as GaAs. The substrate 12 may include for example monocrystalline silicon, polysilicon, amorphous silicon, monocrystalline silicon germanium, polycrystalline silicon germanium, carbon-doped silicon, or a combination thereof.

Forming the trench 13 may include a plurality of patterning processes, mask removal processes and cleaning processes. In one embodiment, forming the trench 13 may include a double patterning process. Each of the first trench 13N and the second trench 13W may have an upper portion wider than a lower portion, and the preliminary active region 15 may have an upper portion narrower than a lower portion. However, for the sake of simplicity in explanation, it will be illustrated and described that the widths of the upper portions and the lower portions are similar. The second trench 13W may be formed deeper into the substrate 12 than the first trench 13N. The bottom of the second trench 13W may be formed at a lower level than the bottom of the first trench 13N. The substrate 12 may be exposed on the sidewalls and bottom of the trench 13. The preliminary active region 15 may have a height larger than a horizontal width. The upper end of the preliminary active region 15 may have the first width W1, as shown in FIG. 3.

Referring to FIGS. 1, 2 and 4, a buffer layer 25 may be formed on the preliminary active region 15 (B20). The buffer layer 25 may be formed along the surface of the preliminary active region 15. The buffer layer 25 may cover the upper and side surfaces of the preliminary active region 15. The buffer layer 25 may be formed to cover the inner walls and bottom of the trench 13. The buffer layer 25 may have a thickness of 0.1 nm (nanometer) to 1 nm. The buffer layer 25 may include for example silicon oxide, silicon nitride or silicon oxynitride, and combinations thereof. By the formation of the buffer layer 25, the upper and side surfaces of the preliminary active region 15 may be recessed under the buffer layer.

Forming the buffer layer 25 may be performed in a temperature range of 500° C. to 900° C. In one embodiment, forming the buffer layer 25 may include a first heat treatment process performed in a temperature range of 520° C. to 580° C. The first heat treatment process for forming the buffer layer 25 may be performed using a single piece of equipment, furnace equipment or a combination thereof. The first heat treatment process for forming the buffer layer 25 may include supplying a gas or radicals containing N and O onto the preliminary active region 15. For example, the first heat treatment process may include loading the substrate 12 with the preliminary active region 15 into the furnace equipment and supplying nitrogen gas and/or oxygen gas, and the oxygen gas may be supplied at a flow rate range from 0.1 SLM (standard liter per minute) to 1 SLM. The first heat treatment process for forming the buffer layer 25 may be performed for 30 minutes to 60 minutes. Impurities in the preliminary active region 15 may be released while the first heat treatment process is performed. For example, after the first heat treatment process is performed, the concentration of chlorine (Cl) in the preliminary active region 15 may decrease. The present invention is not necessarily limited to the ranges disclosed above. Furthermore, the present invention covers any intermittent value within the disclosed ranges.

In one embodiment, forming the buffer layer 25 may be performed using a wet cleaning process. For example, the wet cleaning process for forming the buffer layer 25 may include supplying a cleaning solution containing DI Water and hydrogen peroxide ($H_2O_2$) onto the preliminary active region 15.

In another embodiment, forming the buffer layer 25 may include a plasma process of supplying nitrogen gas and oxygen radicals onto the preliminary active region 15.

Referring to FIG. 5, the buffer layer 25 may conformally cover the upper and side surfaces of the preliminary active region 15. The buffer layer 25 may be formed as the silicon of the preliminary active region 15 is oxidized and/or nitrided. By the formation of the buffer layer 25, the surface of the preliminary active region 15 may be recessed (reduced in a lateral dimension). Due to the formation of the buffer layer 25, the horizontal width of the preliminary active region 15 may decrease to be smaller than the first width W1 before the formation of the buffer layer 25.

Figure 6:
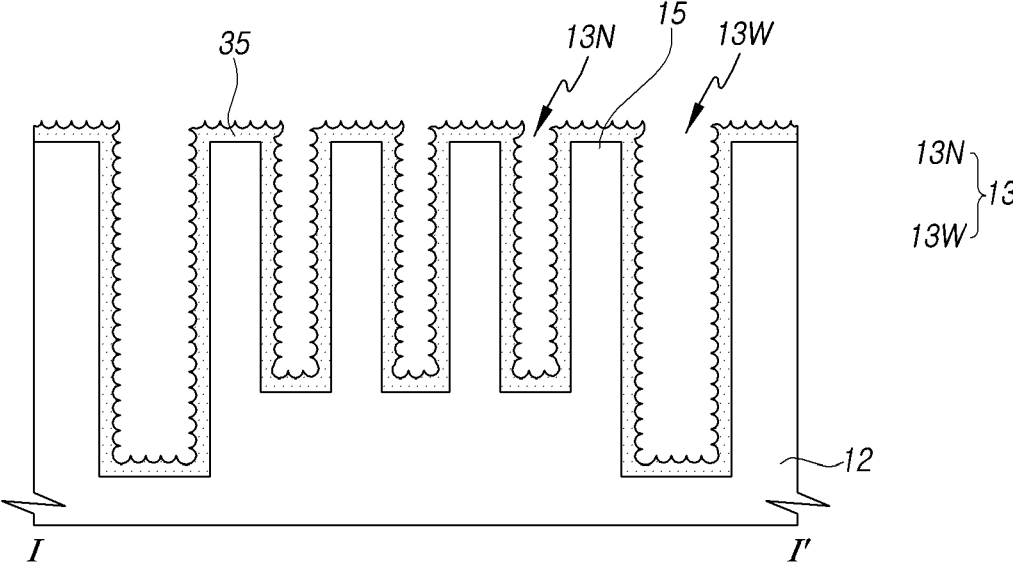

Referring to FIGS. 1, 2 and 6, a sacrificial layer 35 may be formed on the preliminary active region 15 (B30). The sacrificial layer 35 may include ammonium fluorosilicate (AFS) (chemical formula: $(NH_4)_2[SiF_6]$). Forming the sacrificial layer 35 may include a chemical reaction process of replacing the buffer layer 25 with the sacrificial layer 35. Due to a low impurity content (for example, a low chlorine (Cl) concentration) in the preliminary active region 15 and the role of the buffer layer 25 uniformly covering the surface of the preliminary active region 15, the ammonium fluorosilicate (AFS) contained in the sacrificial layer 35 may be formed to have a uniform distribution as compared to the conventional art.

In another embodiment, the chemical reaction process of forming the sacrificial layer 35 may include loading the substrate 12 with the buffer layer 25 into a vacuum chamber and supplying a reactive gas such as for example a nitrogen-containing gas, a fluorine-containing gas, a hydrogen-containing gas or a combination thereof at room temperature. The chemical reaction process of forming the sacrificial layer 35 may include supplying a purge gas or a carrier gas in addition to the reactive gas. The purge gas or the carrier gas may include for example helium, hydrogen, nitrogen, argon or a combination thereof. The purge gas or the carrier gas may be supplied simultaneously or sequentially with the reactive gas. The chemical reaction process of forming the sacrificial layer 35 may use plasma.

For example, the chemical reaction process of forming the sacrificial layer 35 may be performed for 17 seconds to 20 seconds by loading the substrate 12 with the buffer layer 25 into a vacuum chamber and supplying nitrogen trifluoride ($NF_3$) gas, ammonia ($NH_3$) gas, hydrogen ($H_2$) gas and argon (Ar) gas at room temperature.

Figure 7:
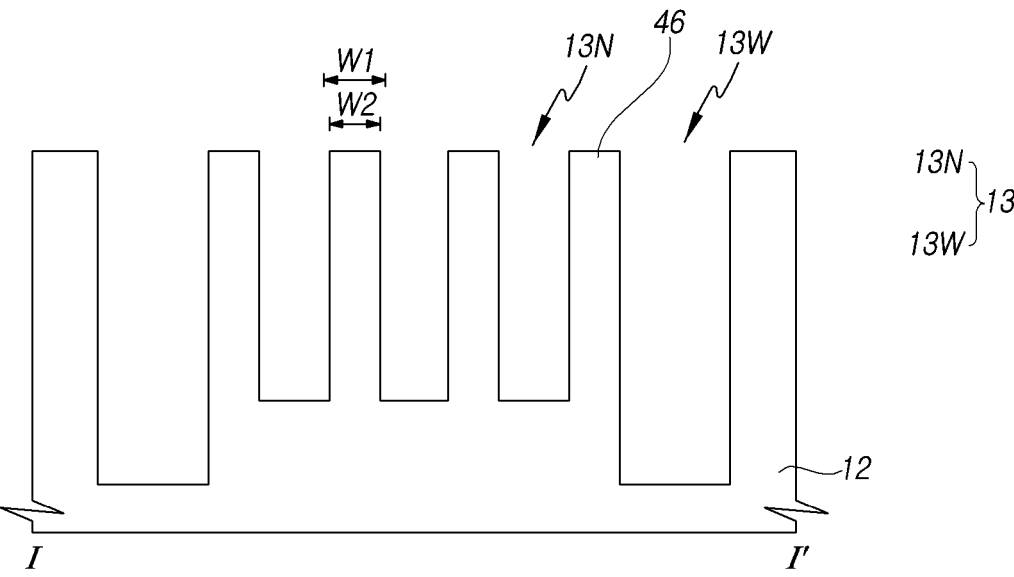

Referring to FIGS. 1, 2 and 7, by removing the sacrificial layer 35, an active region 46 may be exposed (B40). While the processes of forming and removing the buffer layer 25 and the sacrificial layer 35 are performed, the surface of the preliminary active region 15 may be recessed to form the active region 46. The height of the active region 46 may be larger than the horizontal width of the active region 46. The upper end of the active region 46 may have a second width W2. The second width W2 of the active region 46 may be smaller than the first width W1 of the preliminary active region 15. In another embodiment, the second width W2 may be smaller than the first width W1 by 0.5 nm to 1.1 nm. Due to the role of ammonium fluorosilicate (AFS) with a uniform distribution included in the buffer layer 25 and the sacrificial layer 35 which uniformly cover the surface of the preliminary active region 15, the surface recess amount of the preliminary active region 15 may be reduced compared to the conventional art.

Exposing the active region 46 by removing the sacrificial layer 35 may include a second heat treatment process. The second heat treatment process may be performed at a lower temperature than the first heat treatment process. The second heat treatment process may be performed at a temperature range of 80° C. to 150° C.

In another embodiment, the second heat treatment process of removing the sacrificial layer 35 may be performed for about 150 seconds in a chamber to which nitrogen ($N_2$) gas is supplied. The present disclosure is not limited to the specific time of 150 seconds. While the second heat treatment process is performed, the sacrificial layer 35 may be sublimated from a solid state to a gaseous state and be discharged to the outside of the chamber. For example, while the second heat treatment process is performed, the sacrificial layer 35 may be removed by being sublimated into gases of $SiF_4$, $NH_3$ and HF.

Figure 8:
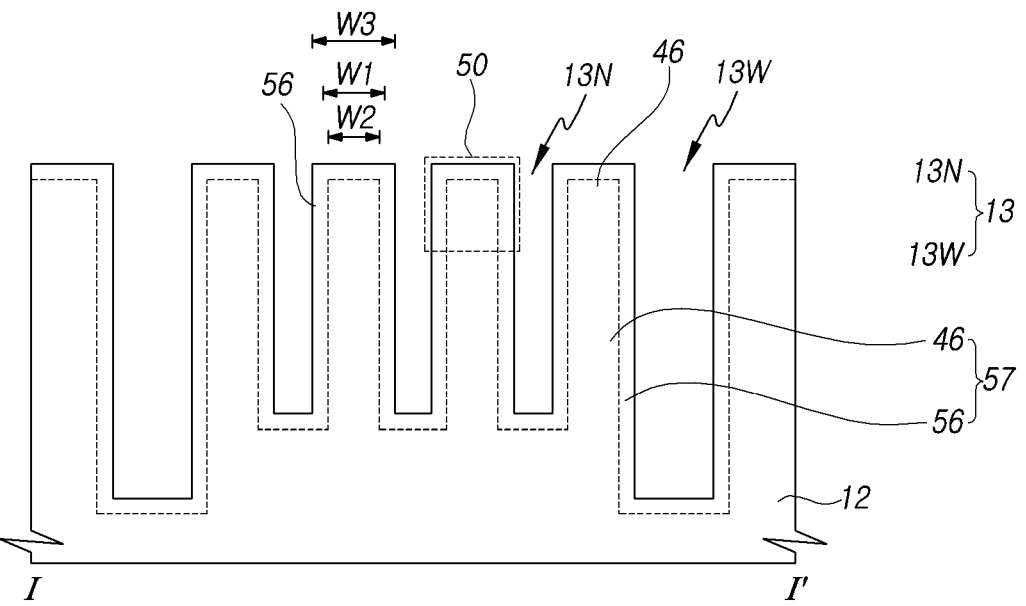
Figure 9:
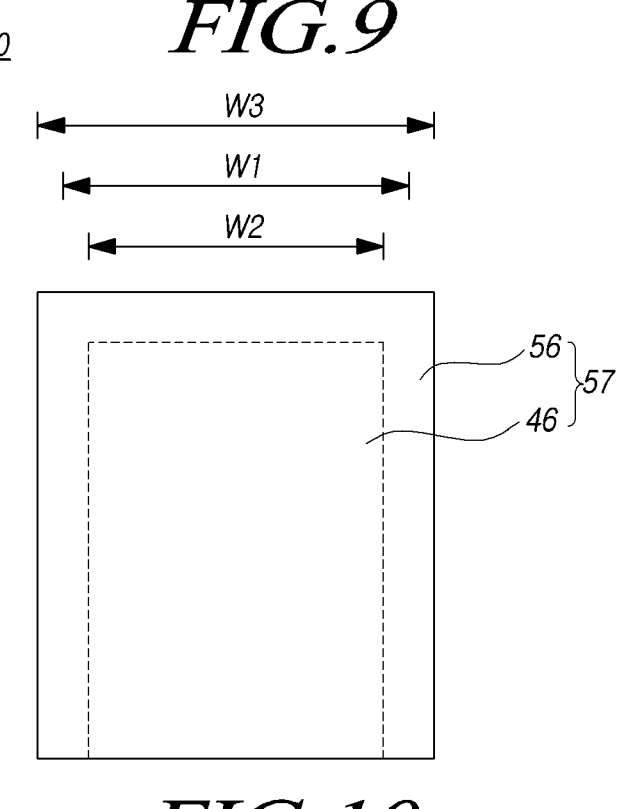
FIG. 9 is a partial view for explaining a portion of FIG. 8.

Referring to FIGS. 1, 2 and 8, a semiconductor liner 56 may be formed on the active region 46 (B50). The active region 46 and the semiconductor liner 56 may constitute the active pattern 57. The semiconductor liner 56 may include for example monocrystalline silicon, polysilicon or a combination thereof. The semiconductor liner 56 may cover the upper and side surfaces of the active region 46 to a uniform thickness. The semiconductor liner 56 may cover the bottom and sidewalls of the trench 13. The semiconductor liner 56 may have a thickness ranging from 1 nm to 4 nm. The upper end of the active pattern 57 may have a third width W3. The third width W3 of the active pattern 57 may be larger than the second width W2 of the active region 46. The third width W3 may be larger than the second width W2 by 2 nm to 8 nm. The third width W3 of the active pattern 57 may be larger than the first width W1 of the preliminary active region 15.

Forming the semiconductor liner 56 on the active region 46 may include a selective epitaxial growth (SEG) process or a selective poly growth (SPG) process. The process of forming the semiconductor liner 56 on the active region 46 may be performed for about 60 seconds at a temperature range of 400° C. to 900° C. The process of forming the semiconductor liner 56 on the active region 46 may be performed using a single piece of equipment, furnace equipment or a combination thereof.

In one embodiment, exposing the active region 46 by removing the sacrificial layer 35 (B40) and forming the semiconductor liner 56 (B50) may be performed in situ in a single piece of equipment. In another embodiment, forming the sacrificial layer 35 (B30), exposing the active region 46 by removing the sacrificial layer 35 (B40) and forming the semiconductor liner 56 (B50) may be performed in situ in a single piece of equipment. In another embodiment, forming the buffer layer 25 (B20), forming the sacrificial layer 35 (B30), exposing the active region 46 by removing the sacrificial layer 35 (B40) and forming the semiconductor liner 56 (B50) may be performed in situ in a single piece of equipment.

Referring to FIG. 9, the semiconductor liner 56 may conformally cover the upper and side surfaces of the active region 46. The semiconductor liner 56 may have a thickness of 1 nm to 4 nm. The third width W3 of the active pattern 57 may be larger than the second width W2 of the active region 46. The third width W3 may be larger than the second width W2 by 2 nm to 8 nm. The third width W3 of the active pattern 57 may be larger than the first width W1 of the preliminary active region 15. In an embodiment, the second width W2 of the active region 46 may be in the range of 10 to 30 nm.

Figure 10:
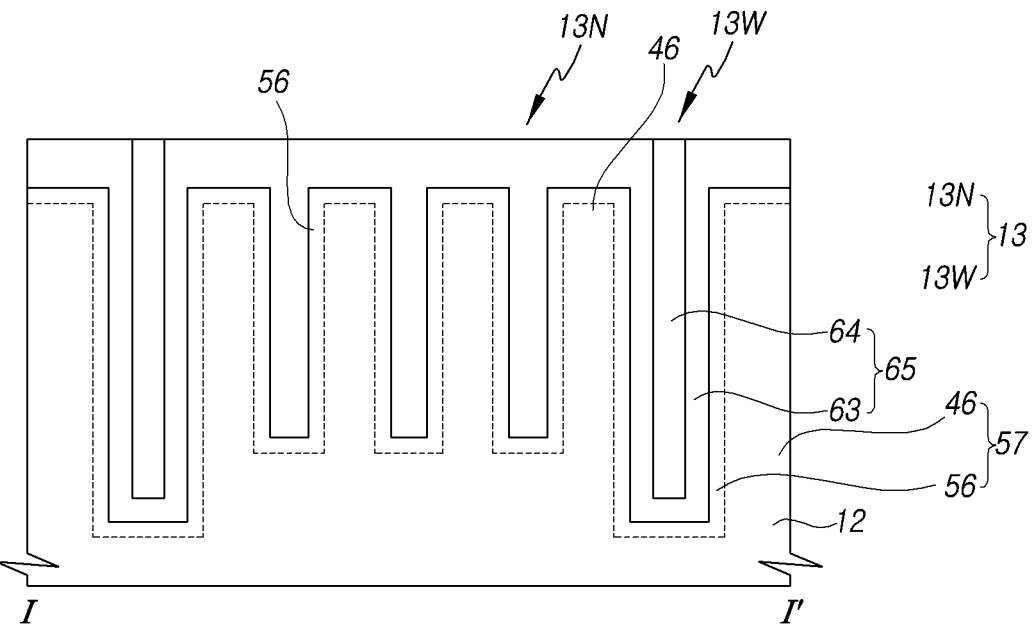

Referring to FIGS. 1, 2 and 10, an isolation layer 65 which fills the trench 13 may be formed on the semiconductor liner 56 (B60). The isolation layer 65 may include a first isolation layer 63 and a second isolation layer 64. The active pattern 57 may be delimited by the trench 13 and the isolation layer 65.

The first isolation layer 63 may be formed on the semiconductor liner 56. The first isolation layer 63 may contact the surface of the semiconductor liner 56. The first isolation layer 63 may completely fill the first trench 13N and cover the upper surface of the semiconductor liner 56. The second isolation layer 64 may be formed on the first isolation layer 63. The second isolation layer 64 may completely fill the second trench 13W.

The isolation layer 65 may include at least two elements selected from the group consisting of Si, O, N, B, C and H. The isolation layer 65 may include for example silicon oxide, silicon nitride, silicon oxynitride or a combination thereof. In one embodiment, the first isolation layer 63 may include silicon oxide. The second isolation layer 64 may include silicon nitride.

According to another embodiment of the disclosed technology, while the processes of forming the buffer layer 25 (B20), forming the sacrificial layer 35 (B30) and exposing the active region 46 by removing the sacrificial layer 35 (B40) are performed, the buffer layer 25 may serve to prevent occurrence of a defect such as leaning of the active region 46.

In another embodiment, while the first heat treatment process of forming the buffer layer 25 is performed, the concentration of an impurity such as chlorine (Cl) in the preliminary active region 15 may decrease. For example, first and second samples were fabricated, including the active pattern 57, which has the semiconductor liner 56 on the active region 46. The first sample was formed by including the first heat treatment process of forming the buffer layer 25 according to this embodiment of the disclosed technology. The second sample was formed by omitting the process of forming the buffer layer 25 and performing, under substantially the same condition as the first sample, the remaining processes, that is, forming the trench 13 (B10), forming a sacrificial layer (B30), exposing an active region by removing the sacrificial layer (B40) and forming a semiconductor liner (B50). At the interface region between the semiconductor liner 56 and the active region 46, the chlorine (Cl) intensities of the first and second samples were compared and analyzed using SIMS (secondary ion mass spectrometry). The chlorine (Cl) intensity of the first sample was determined to have an average value of 7, with a minimum value of 6 and a maximum value of 10. The chlorine (Cl) intensity of the second sample was determined to have an average value of 100, with a minimum value of 90 and a maximum value of 150. As can be seen from the analysis results, the chlorine (Cl) intensity of the first sample is significantly lower than that of the second sample. According to one embodiment of the present disclosure, the chlorine (Cl) concentration of the first sample formed by including the first heat treatment process of forming the buffer layer 25 is significantly decreased compared to the second sample formed by omitting the process of forming the buffer layer 25.

In another embodiment, due to the first heat treatment process of forming the buffer layer 25, the concentration of an impurity such as chlorine (Cl) in the preliminary active region 15 may decrease, and the buffer layer 25 which uniformly covers the surface of the preliminary active region 15 may be formed. Due to the low impurity concentration and the uniform buffer layer 25, the ammonium fluorosilicate (AFS) included in the sacrificial layer 35 may be formed to have a uniform distribution compared to the conventional art. While the process of exposing the active region 46 by removing the sacrificial layer 35 (B40) is performed, the ammonium fluorosilicate (AFS) having the uniform distribution may serve to prevent leaning of the active region 46. While the process of exposing the active region 46 (B40) is performed, due to the presence of the buffer layer 25 and the sacrificial layer 35, the surface recess amount of the preliminary active region 15 may be reduced (for example, the surface recess amount is reduced by about 30%) compared to the conventional art, leaving more material to support the active region 46.

Figure 11:
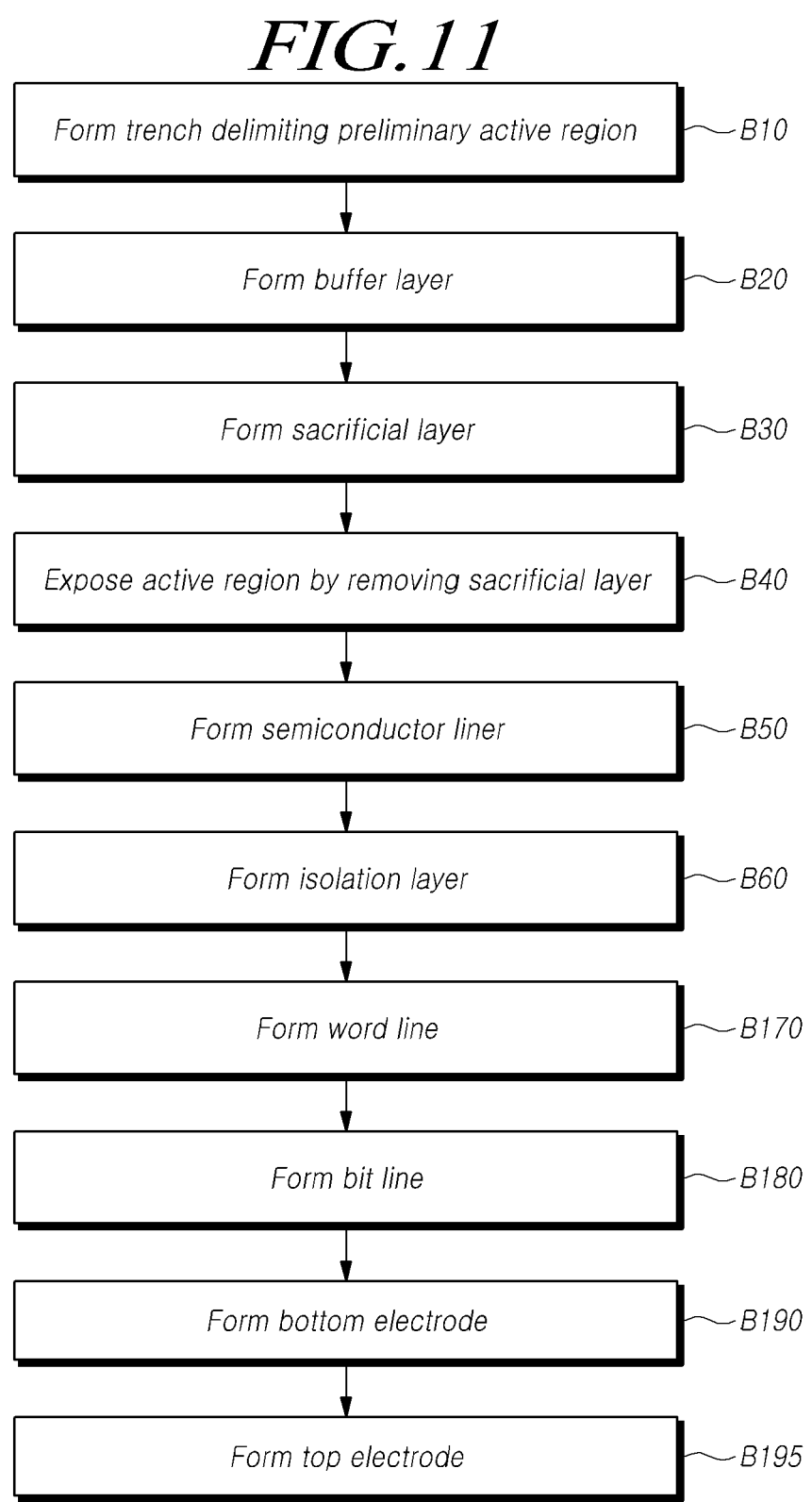
FIG. 11 is a flowchart for explaining a method for forming a semiconductor device based on another embodiment of the disclosed technology.
Figure 12:
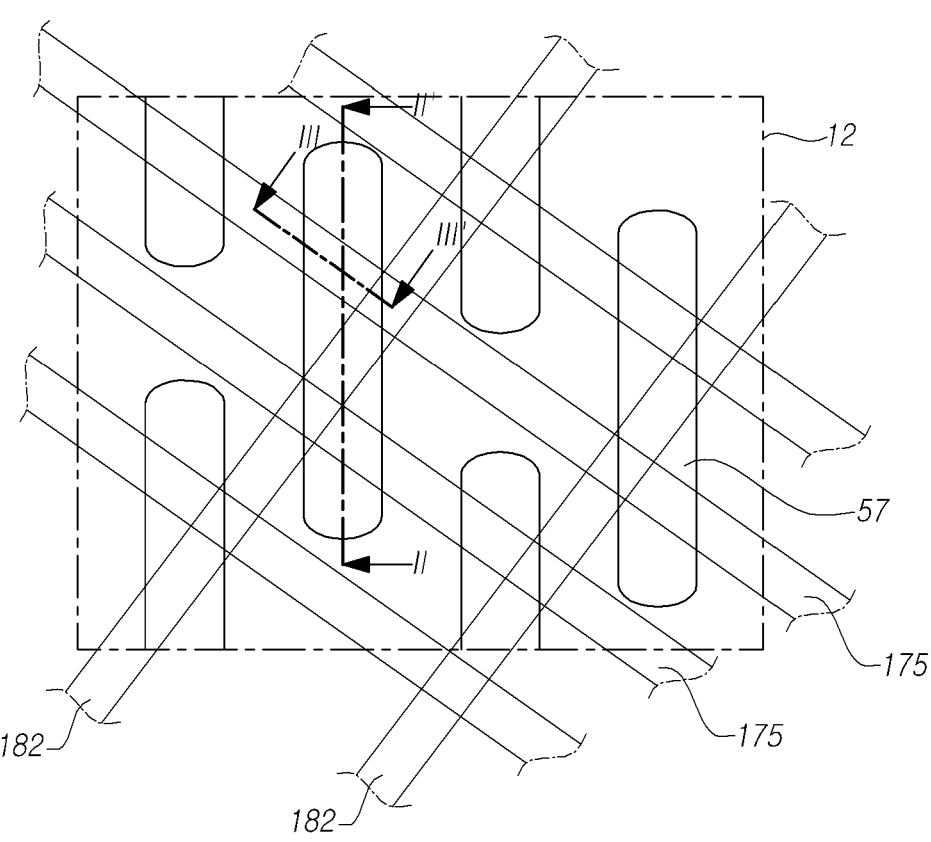
FIG. 12 is a layout diagram for explaining the method for forming a semiconductor device based on still another embodiment of the disclosed technology.

FIG. 11 is a flowchart for explaining a method for forming a semiconductor device based on various embodiments of the disclosed technology. FIG. 12 is a layout diagram for explaining the method for forming a semiconductor device based on this embodiment of the disclosed technology, and FIGS. 13 to 17 are cross-sectional views taken along the lines II-II' and III-III' of FIG. 12. The semiconductor device based on the embodiment of the disclosed technology may include a DRAM.

Referring to FIG. 11, the method for forming a semiconductor device based on one embodiment of the disclosed technology may include forming a trench delimiting a preliminary active region (B10), forming a buffer layer (B20), forming a sacrificial layer (B30), exposing an active region by removing the sacrificial layer (B40), forming a semiconductor liner (B50), forming an isolation layer (B60), forming a word line (B170), forming a bit line (B180), forming a bottom electrode (B190), and forming a top electrode (B195).

Referring to FIG. 12, a plurality of active patterns 57 may be regularly disposed on a substrate 12. A plurality of word lines 175 which traverse the plurality of active patterns 57 and are parallel to each other may be disposed. A plurality of bit lines 182 which traverse the plurality of active patterns 57 and are parallel to each other may be disposed. The plurality of bit lines 182 may intersect with the plurality of word lines 175.

Figure 13:
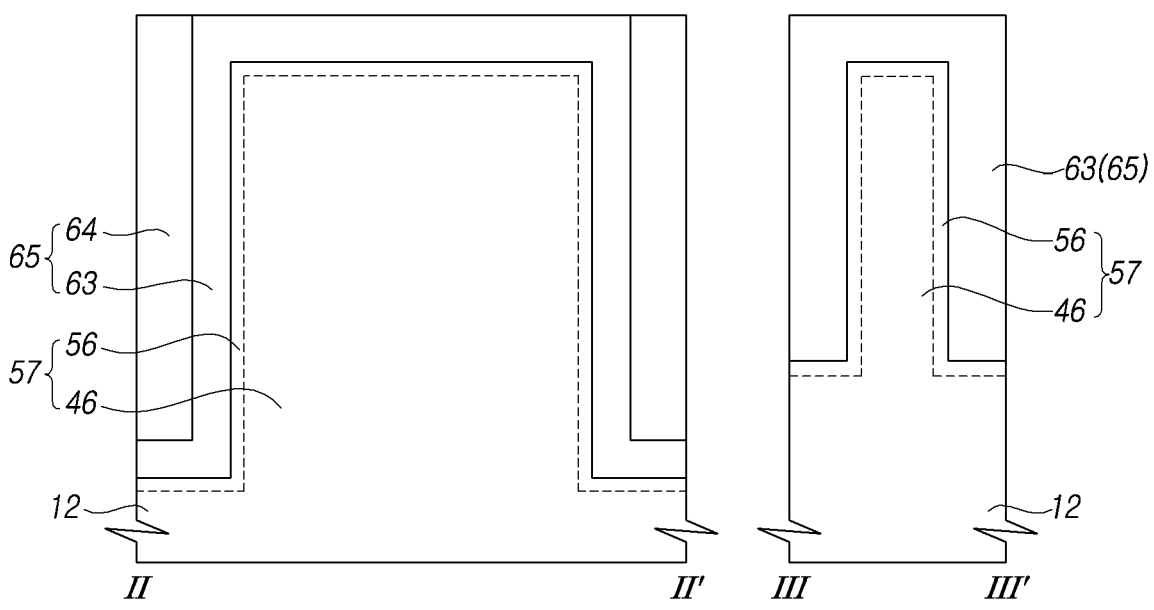
FIGS. 13 to 17 are cross-sectional views for explaining the method for forming a semiconductor device based on further embodiments of the disclosed technology.

Referring to FIGS. 11, 12 and 13, similarly to the method described above with reference to FIGS. 1 to 10, the method for forming a semiconductor device based on the embodiment of the disclosed technology may include forming, in a substrate 12, a trench 13 which delimits a preliminary active region 15 (B10), forming a buffer layer 25 on the preliminary active region 15 (B20), forming a sacrificial layer 35 on the preliminary active region 15 (B30), exposing an active region 46 by removing the sacrificial layer 35 (B40), forming a semiconductor liner 56 on the active region 46 (B50), and forming, on the semiconductor liner 56, an isolation layer 65 which fills the trench 13 (B60).

The active region 46 and the semiconductor liner 56 may constitute the active pattern 57. The isolation layer 65 may include a first isolation layer 63 and a second isolation layer 64. The active pattern 57 may be delimited on the substrate 12 by the isolation layer 65.

Figure 14:
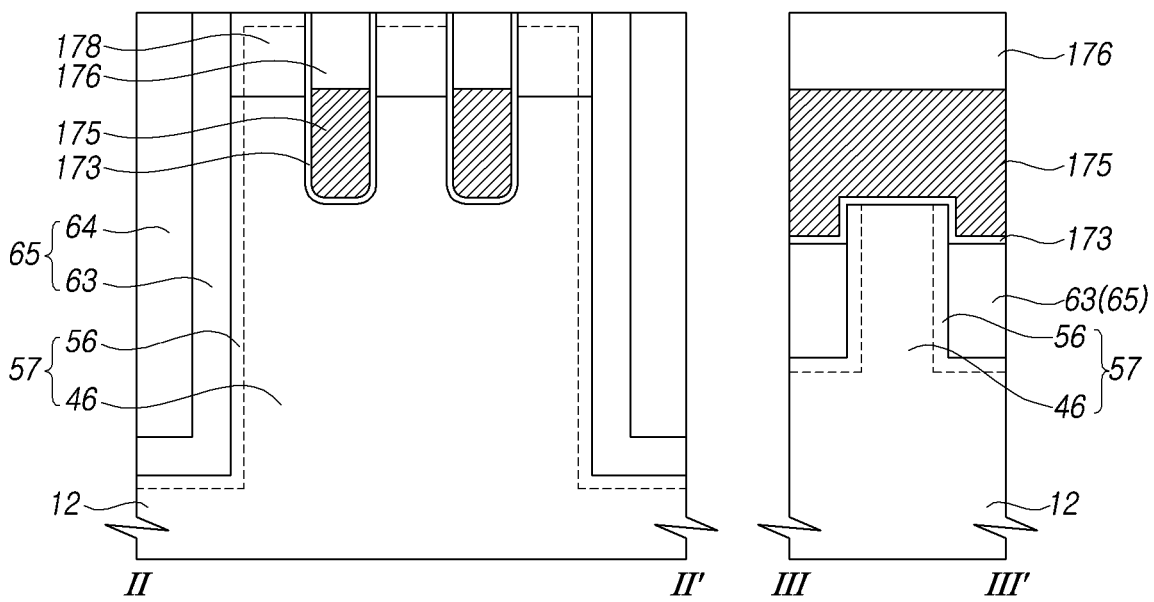

Referring to FIGS. 11, 12 and 14, the word line 175 which traverses the active pattern 57 may be formed (B170). The plurality of word lines 175 may be repeatedly disposed parallel to each other. A gate dielectric layer 173 may be formed between the word line 175 and the active pattern 57. A gate capping layer 176 may be formed on the word line 175. A plurality of source/drain regions 178 may be formed in the active pattern 57 adjacent to both sides of the word line 175.

The plurality of source/drain regions 178 may be formed by implanting N-type or P-type impurities partially into the active region 46 and the semiconductor liner 56. The plurality of source/drain regions 178 may include impurities of a conductivity type different from that of the active region 46. In another embodiment, the active region 46 may include P-type impurities such as for example boron (B). The plurality of source/drain regions 178 may include N-type impurities such as for example phosphorus (P), arsenic (As) or a combination thereof.

The gate dielectric layer 173 may be formed to surround the lower and side surfaces of the word line 175. The gate dielectric layer 173 may extend between the word line 175 and the isolation layer 65. The gate dielectric layer 173 may include for example silicon oxide, silicon nitride, silicon oxynitride, high-K dielectric or a combination thereof. In one embodiment, the gate dielectric layer 173 may include silicon oxide.

The word line 175 may be formed at a level lower than the upper end of the active pattern 57. The word line 175 may extend onto the isolation layer 65 while traversing the active pattern 57. The lowermost end of the word line 175 may be formed at a level lower than the upper surface of an adjacent active pattern 57. The uppermost end of the word line 175 may be formed at a level lower than the upper surface of the adjacent active pattern 57 and the uppermost end of the adjacent isolation layer 65. The word line 175 may be formed of a single layer or a multilayer. The word line 175 may include a conductive material such as for example metal, metal nitride, metal oxide, metal silicide, conductive carbon, polysilicon or a combination thereof. The word line 175 may include for example W, WN, Ru, Co, Pt, Ti, TiN, Ta, TaN, polysilicon or a combination thereof.

The gate capping layer 176 may include an insulating material such as for example silicon oxide, silicon nitride, silicon oxynitride or a combination thereof. In one embodiment, the upper surfaces of the isolation layer 65, the gate dielectric layer 173, the gate capping layer 176 and the plurality of source/drain regions 178 may form substantially the same plane.

The active pattern 57, the gate dielectric layer 173, the word line 175 and the plurality of source/drain regions 178 may constitute a transistor. The active pattern 57, the gate dielectric layer 173, the word line 175 and the plurality of source/drain regions 178 may correspond to a recess channel transistor. In another embodiment, the transistor may include a planar transistor, a recess channel transistor, a vertical transistor, a fin field effect transistor (finFET), a gate all around (GAA) transistor, a multi-bridge channel transistor or a combination thereof.

Figure 15:
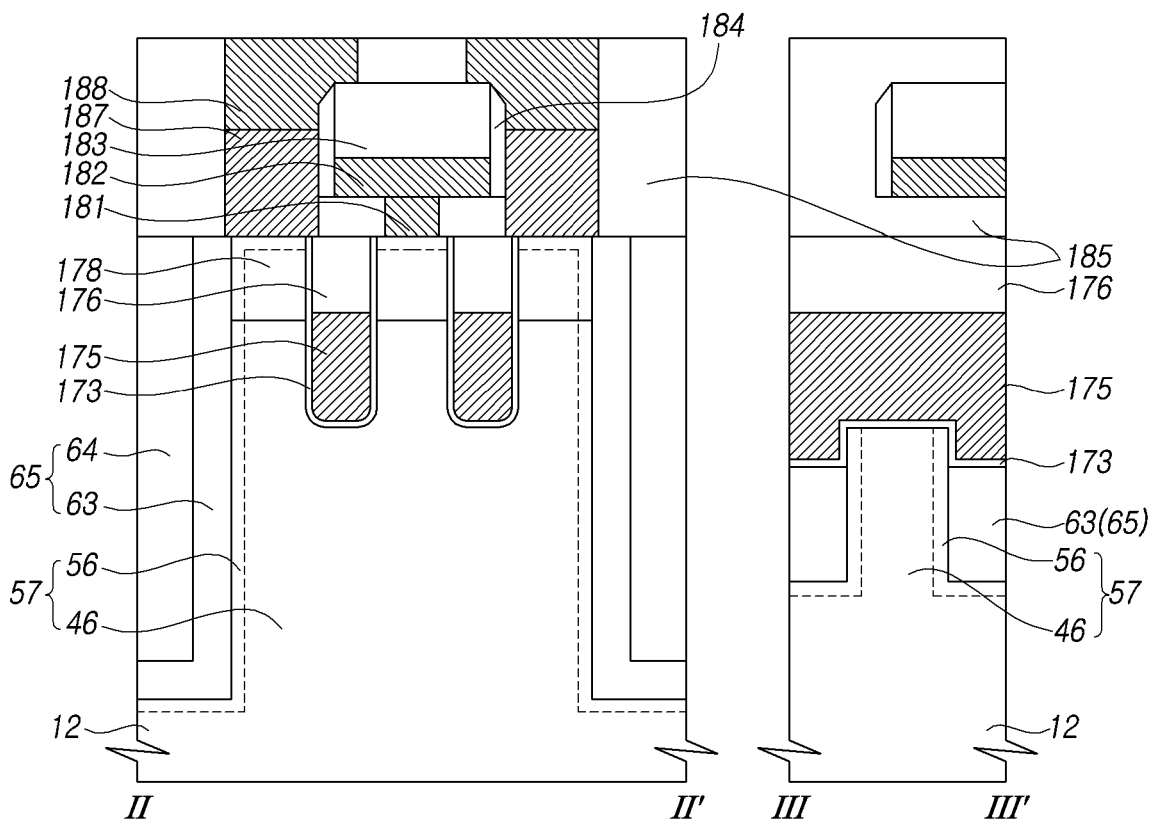

Referring to FIGS. 11, 12 and 15, the bit line 182 which is connected to one of the plurality of source/drain regions 178 may be formed (B180). An interlayer insulating layer 185 which covers the isolation layer 65, the gate dielectric layer 173, the gate capping layer 176 and the plurality of source/drain regions 178 may be formed. A bit line contact plug 181, the bit line 182, a bit line capping layer 183, a bit line spacer 184, a storage contact plug 187 and a landing pad 188 may be formed in the interlayer insulating layer 185.

The bit line 182 may traverse over the word line 175. The plurality of bit lines 182 may be repeatedly formed parallel to each other. The bit line contact plug 181 may be formed between one of the plurality of source/drain regions 178 and the bit line 182. The bit line contact plug 181 may contact the one of the plurality of source/drain regions 178 and the bit line 182. The bit line capping layer 183 may be formed on the bit line 182. The bit line spacer 184 may cover the side surfaces of the bit line 182 and the bit line capping layer 183.

The storage contact plug 187 may pass through the interlayer insulating layer 185 and contact another of the plurality of source/drain regions 178. The landing pad 188 may be formed on the storage contact plug 187. The landing pad 188 may contact the storage contact plug 187. The upper surfaces of the landing pad 188 and the interlayer insulating layer 185 may form substantially the same plane.

Each of the bit line contact plug 181, the bit line 182, the storage contact plug 187 and the landing pad 188 may be formed of a single layer or a multilayer. Each of the bit line contact plug 181, the bit line 182, the storage contact plug 187 and the landing pad 188 may include a conductive material such as for example metal, metal nitride, metal oxide, metal silicide, conductive carbon, polysilicon or a combination thereof. Each of the bit line contact plug 181, the bit line 182, the storage contact plug 187 and the landing pad 188 may include for example W, WN, Ru, Co, Pt, Ti, TiN, Ta, TaN, polysilicon or a combination thereof.

Each of the bit line capping layer 183, the bit line spacer 184 and the interlayer insulating layer 185 may be formed of a single layer or a multilayer. For example, the interlayer insulating layer 185 may include a plurality of insulating layers and etch stop layers. Each of the bit line capping layer 183, the bit line spacer 184 and the interlayer insulating layer 185 may include silicon oxide, silicon nitride, silicon oxynitride, high-K dielectric, low-K dielectric or a combination thereof.

Figure 16:
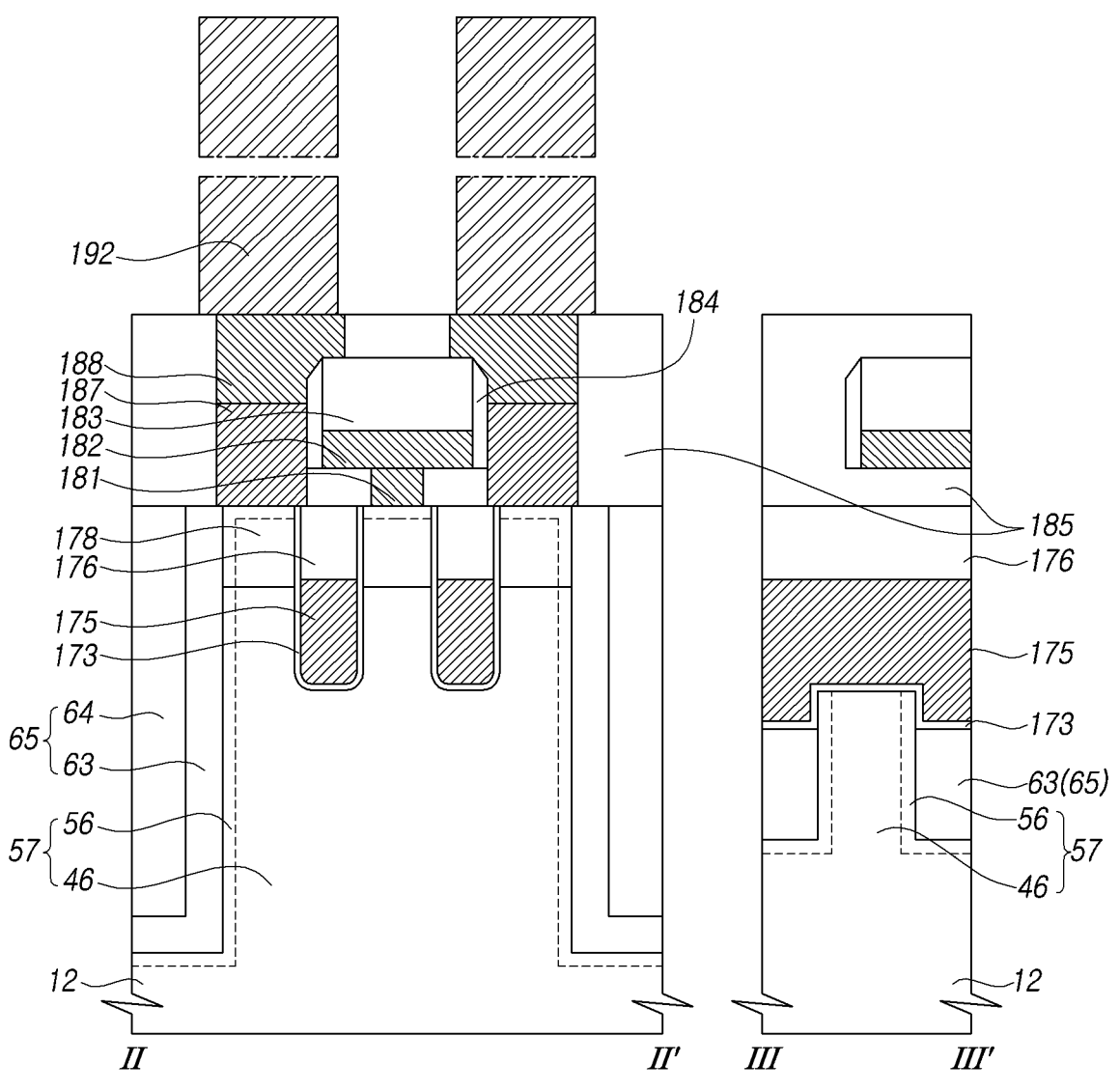

Referring to FIGS. 11, 12 and 16, a bottom electrode 192 may be formed on the landing pad 188 (B190). The bottom electrode 192 may include a pillar shape, a cylinder shape, a box shape or a combination thereof. The bottom electrode 192 may contact the landing pad 188. The bottom electrode 192 may be electrically connected to the other one of the plurality of source/drain regions 178 via the landing pad 188 and the storage contact plug 187. The bottom electrode 192, the landing pad 188 and the storage contact plug 187 may constitute a storage node.

Figure 17:
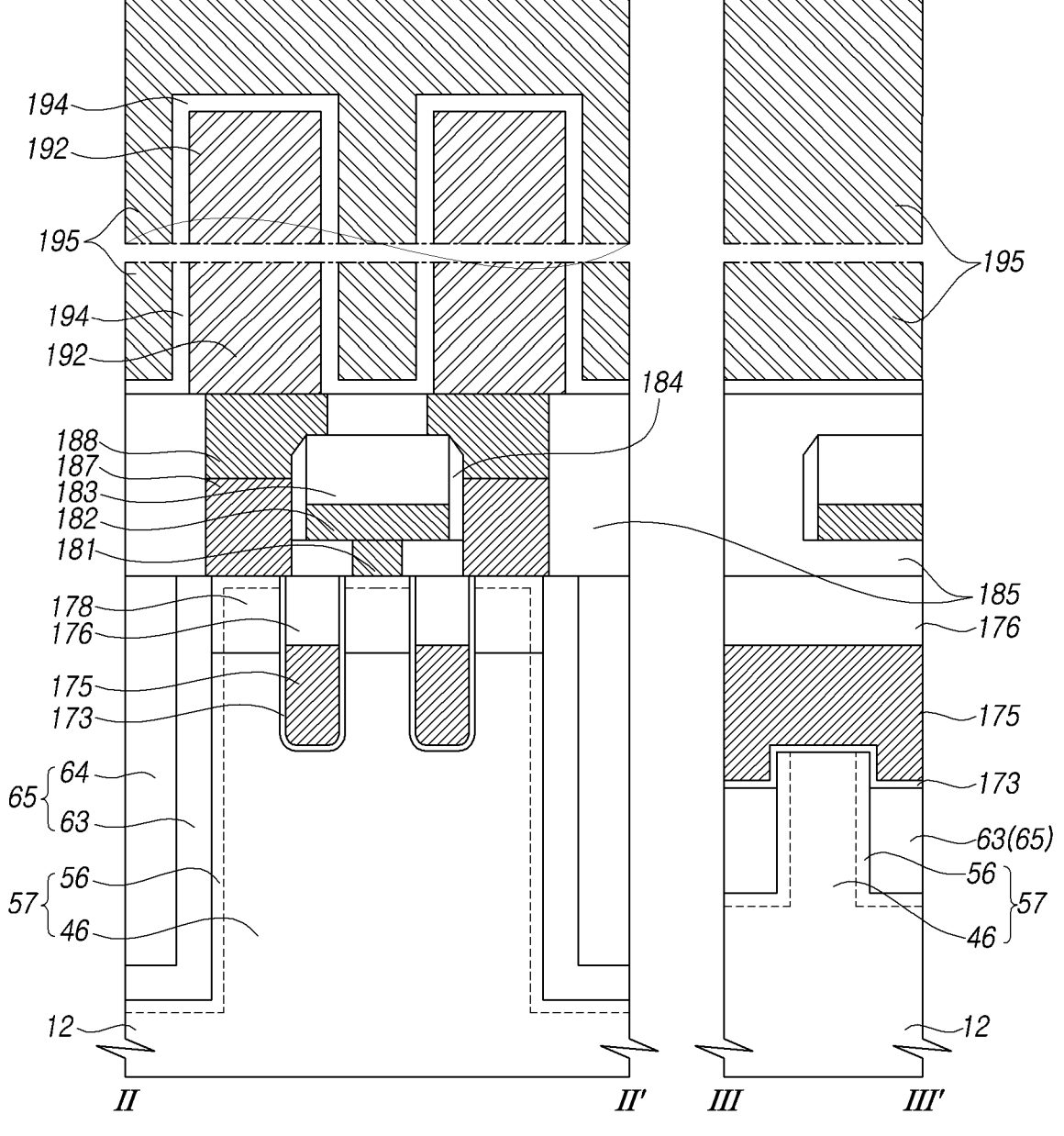

Referring to FIGS. 11, 12 and 17, a capacitor dielectric layer 194 and a top electrode 195 may be formed on the bottom electrode 192 (B195). The capacitor dielectric layer 194 may conformally cover the upper and side surfaces of the bottom electrode 192, and may extend onto the interlayer insulating layer 185. The capacitor dielectric layer 194 may include for example silicon oxide, silicon nitride, silicon oxynitride, high-K dielectric or a combination thereof. The top electrode 195 may cover the capacitor dielectric layer 194.

Each of the bottom electrode 192 and the top electrode 195 may include a conductive material such as for example metal, metal nitride, metal oxide, metal silicide, conductive carbon, polysilicon or a combination thereof. Each of the bottom electrode 192 and the top electrode 195 may include for example W, WN, Ru, Co, Pt, Ti, TiN, Ta, TaN or a combination thereof. The bottom electrode 192, the capacitor dielectric layer 194 and the top electrode 195 may constitute a capacitor.

In another embodiment, the bottom electrode 192, the capacitor dielectric layer 194 and the top electrode 195 may correspond to a cell capacitor. The active pattern 57, the gate dielectric layer 173, the word line 175 and the plurality of source/drain regions 178 may correspond to a cell transistor. The cell capacitor may be electrically connected to the cell transistor. The cell capacitor and the cell transistor may constitute a DRAM cell.

Although exemplary embodiments of the disclosure have been described for illustrative purposes, those skilled in the art will appreciate that various modifications, additions and substitutions are possible, without departing from the scope of the disclosure. Therefore, the embodiments disclosed above and in the accompanying drawings should be considered in a descriptive sense only and not for limiting the technological scope. The technological scope of the disclosure is not limited by the embodiments and the accompanying drawings. The scope of the disclosure encompasses all equivalents of the elements disclosed above.

What is claimed is:

1. A method for forming a semiconductor device, comprising:
forming, on a substrate, a trench which delimits a preliminary active region;
forming a buffer layer on the preliminary active region using a first heat treatment process that is performed at 520° C. to 580° C.;
forming a sacrificial layer on the preliminary active region by replacing the buffer layer;
exposing an active region by removing the sacrificial layer; and
forming a semiconductor liner on the active region.

2. The method according to claim 1, wherein the first heat treatment process includes supplying a gas or radicals containing N and O onto the preliminary active region.

3. The method according to claim 1, wherein the first heat treatment process includes supplying nitrogen gas and oxygen gas onto the preliminary active region, and the oxygen gas is supplied at a flow rate ranging from 0.1 SLM (standard liter per minute) to 1 SLM.

4. The method according to claim 1, wherein a thickness of the buffer layer ranges from 0.1 nm to 1 nm.

5. The method according to claim 1, wherein the buffer layer includes at least one or more of silicon oxide, silicon nitride or silicon oxynitride.

6. The method according to claim 1, wherein the forming of the sacrificial layer by replacing the buffer layer comprises:
supplying a reactive gas such as a nitrogen-containing gas, a fluorine-containing gas, a hydrogen-containing gas or a combination thereof onto the substrate with the buffer layer.

7. The method according to claim 1, wherein the forming of the sacrificial layer by replacing the buffer layer comprises:

supplying nitrogen trifluoride ($NF_3$) gas, ammonia ($NH_3$) gas, hydrogen ($H_2$) gas and argon (Ar) gas onto the substrate with the buffer layer.

8. The method according to claim 1, wherein the sacrificial layer includes ammonium fluorosilicate (($NH_4)_2[SiF_6]$).

9. The method according to claim 1, wherein the exposing of the active region by removing the sacrificial layer includes a second heat treatment process that is performed at a temperature of 80° C. to 150° C.

10. The method according to claim 9, wherein the second heat treatment process is performed in a chamber to which nitrogen ($N_2$) gas is supplied.

11. The method according to claim 1, wherein the preliminary active region has a first width, the active region has a second width, and the second width is smaller than the first width by 0.5 nm to 1.1 nm.

12. The method according to claim 1, wherein the forming of the semiconductor liner on the active region includes a selective epitaxial growth (SEG) process or a selective poly growth (SPG) process.

13. The method according to claim 1, wherein the semiconductor liner includes monocrystalline silicon, polysilicon or a combination thereof.

14. The method according to claim 1, wherein a thickness of the semiconductor liner ranges from 1 nm to 4 nm.

15. A method for forming a semiconductor device, comprising:

forming, on a substrate, an isolation layer which delimits an active pattern;

forming a word line which traverses the active pattern;

forming a plurality of source/drain regions in the active pattern adjacent to the word line;

forming a bit line which is connected to one of the plurality of source/drain regions;

forming a bottom electrode which is connected to another one of the plurality of source/drain regions;

forming a capacitor dielectric layer on the bottom electrode; and forming a top electrode on the capacitor dielectric layer, wherein the forming of the isolation layer comprises:

forming, on the substrate, a trench which delimits a preliminary active region;

forming a buffer layer on the preliminary active region using a first heat treatment process that is performed at 520° C. to 580° C.;

forming a sacrificial layer by replacing the buffer layer;

exposing an active region by removing the sacrificial layer;

forming a semiconductor liner on the active region, the active region and the semiconductor liner configuring the active pattern; and forming the isolation layer in the trench.

16. A method for forming a semiconductor liner for accommodating a semiconductor device, comprising:

forming, on a substrate, a trench which delimits a preliminary active region;

forming a buffer layer on the preliminary active region using a first heat treatment process which consumes material of the preliminary active region, and thereby forms for the semiconductor liner a device region having a first width smaller than a second width of the preliminary active region prior to the first treatment;

forming a sacrificial layer by replacing the buffer layer;

removing the sacrificial layer and thereby exposing the device region; and forming the semiconductor device on the device region.

17. The method of claim 16, wherein the first width of the device region is smaller than the second width of the preliminary active region by 0.5 nm to 1.1 nm.

18. The method of claim 16, wherein the device region comprises a strip of a semiconductor wafer, and after removing the sacrificial layer, the first width of the device region is substantial enough so that the device region does not lean.

19. The method of claim 18, wherein the first width of the device region ranges from 10 to 30 nm.

* * * * *